(12) United States Patent
Yano

(10) Patent No.: US 12,073,882 B2
(45) Date of Patent: Aug. 27, 2024

(54) SEMICONDUCTOR MEMORY DEVICE

(71) Applicant: Winbond Electronics Corp., Taichung (TW)

(72) Inventor: Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 188 days.

(21) Appl. No.: 17/975,609

(22) Filed: Oct. 28, 2022

(65) Prior Publication Data

US 2023/0170021 A1 Jun. 1, 2023

(30) Foreign Application Priority Data

Dec. 1, 2021 (JP) .................. 2021-195124

(51) Int. Cl.
*G11C 11/00* (2006.01)
*G11C 13/00* (2006.01)

(52) U.S. Cl.
CPC ...... *G11C 13/0069* (2013.01); *G11C 13/0026* (2013.01); *G11C 13/0038* (2013.01)

(58) Field of Classification Search
CPC ............ G11C 13/0069; G11C 13/0026; G11C 13/0038; G11C 13/0028; G11C 13/003; G11C 16/0483; G11C 16/08; G11C 16/10; G11C 16/26; G11C 2213/79; G11C 16/0416; G11C 16/20; G11C 16/24; G11C 11/005; G11C 13/004; G11C 16/14; G11C 16/30; Y02D 10/00; G06F 3/0659
USPC ....................................... 365/148
See application file for complete search history.

(56) References Cited

U.S. PATENT DOCUMENTS

| 8,717,805 | B2 * | 5/2014 | Kajigaya | G11C 14/00 365/158 |
| 9,042,160 | B1 | 5/2015 | Gorobets et al. | |
| 9,201,705 | B2 * | 12/2015 | Caraccio | G06F 3/0685 |
| 10,114,746 | B2 * | 10/2018 | Pio | G06F 3/0685 |
| 10,817,222 | B2 | 10/2020 | Kang et al. | |

(Continued)

FOREIGN PATENT DOCUMENTS

| CN | 102200946 | 11/2014 |
| JP | 2011192346 | 9/2011 |
| JP | 6810725 | 1/2021 |

(Continued)

OTHER PUBLICATIONS

"Office Action of Taiwan Counterpart Application", issued on May 24, 2023, p. 1-p. 7.

*Primary Examiner* — Tha-O H Bui
(74) *Attorney, Agent, or Firm* — JCIPRNET

(57) ABSTRACT

A semiconductor memory device capable of automatically restoring writing interrupted due to a momentary stop or a fluctuation of a power supply voltage is provided. A non-volatile memory of the disclosure includes a memory cell array formed with a NOR array and a variable resistance array. When the power supply voltage drops to a power-off level during writing into the NOR array, a reading/writing control unit writes unwritten data into the variable resistance array. Subsequently, when a power-on of the power supply voltage is detected, the reading/writing control unit reads the unwritten data from the variable resistance array and writes the unwritten data into the NOR array, so that interrupted writing is restored.

17 Claims, 11 Drawing Sheets

(56) References Cited

U.S. PATENT DOCUMENTS

2013/0219146 A1\* 8/2013 Confalonieri .......... G11C 16/08
711/202

FOREIGN PATENT DOCUMENTS

| TW | 200842887 | 11/2008 |
|----|-----------|---------|
| TW | I428922 | 3/2014 |
| TW | 201612908 | 4/2016 |
| WO | 2010093356 | 8/2010 |

\* cited by examiner

SEMICONDUCTOR MEMORY DEVICE

CROSS-REFERENCE TO RELATED APPLICATION

This application claims the priority benefit of Japan application serial no. 2021-195124, filed on Dec. 1, 2021. The entirety of the above-mentioned patent application is hereby incorporated by reference herein and made a part of this specification.

BACKGROUND

Technical Field

The disclosure relates to a semiconductor memory device integrating a Not OR (NOR) flash memory and a variable resistance memory.

Description of Related Art

The NOR flash memory is a non-volatile memory that disposes a memory cell between a bit line and a source line, and can perform random access on the memory cell. In addition, in order to increase the integration degree of the NOR flash memory, a virtual ground manner or a multi-value manner is adopted (for example, Japanese Laid-Open No. 2011-192346).

On the other hand, as a non-volatile memory in place of the NOR flash memory, there is a variable resistance memory using a variable resistance element. The variable resistance memory stores data by applying a pulse voltage to the variable resistance element, so that the variable resistance element is reversibly and non-volatilely changed to a high resistance state or a low resistance state (for example, Japanese Patent No. 6810725).

SUMMARY

A NOR flash memory is capable of performing random access on a memory cell, but in order to achieve compatibility with a NAND flash memory, the NOR flash memory is capable of performing writing (programming) in units of pages. The NOR flash memory, for example, receives page data or address according to a data entry command output from a host computer, and subsequently writes the page data into a selected page according to a page writing command. The NOR flash memory holds the page data received in a data register, and writes data selected from the data register into the selected page. Then, the host computer reads status information in order to verify that page writing is completed normally.

However, during page writing, if a power supply voltage to the NOR flash memory is cut off or if the power supply voltage falls lower than the minimum voltage guaranteed for operation, writing is interrupted. Since the data register holding the page data is volatile, if the power supply voltage falls lower than the minimum voltage guaranteed for operation, the page data held in the data register will disappear. Even if the power supply voltage is restored, the NOR flash memory is still unable to restart page writing. In addition, it may be seen that after the power supply voltage is restored, the host computer is unable to normally complete the writing from the status information, and since the host computer is unable to know how much data has been correctly written, page writing must be ultimately performed again from the beginning.

The disclosure provides a semiconductor memory device capable of restoring writing that is interrupted due to a momentary stop or a fluctuation of a power supply voltage.

The semiconductor memory device of the disclosure includes: a memory cell array, including a first memory cell array having a NOR or NAND flash memory structure and a second memory cell array having a variable resistance memory structure; a control unit, controlling reading and writing of a selected memory cell in the first memory cell array or the second memory cell array; and a first detection unit, detecting whether a power supply voltage drops to a power-off level. When the power-off level is detected by the first detection unit during a writing operation to the first memory cell array, the control unit writes an unwritten data that at least has not been written yet into the first memory cell array into the second memory cell array.

According to the disclosure, when the power-off level of the power supply voltage is detected, the unwritten data that has not been written into the first memory cell array is written into the second memory cell array, so that disappearance of the unwritten data can be prevented. When the power supply voltage is restored, the unwritten data is written into the first memory cell array, thereby restoring the interrupted writing.

DESCRIPTION OF THE EMBODIMENTS

A semiconductor memory device of the disclosure is a non-volatile memory formed by combining a NOR flash memory and a variable resistance memory. In the NOR flash memory, high aggregation is in progress, but since a relatively large voltage is required for writing or erasing, low power consumption is not necessarily adequate. On the other hand, even though the variable resistance memory does not require the erasing like the NOR flash memory does and is thus capable of rewriting data with a low voltage, the variable resistance memory has a lower integration degree than the NOR flash memory due to a large memory size. In addition, the variable resistance memory has higher endurance (the number of times that can be rewritten) than the NOR flash memory.

In an embodiment of the disclosure, a memory cell array having the structure of the NOR flash memory and a memory cell array having the structure of the variable resistance memory are integrated on a common substrate. In another embodiment, a chip of the variable resistance memory is stacked on a chip of the NOR flash memory.

Figure 1:
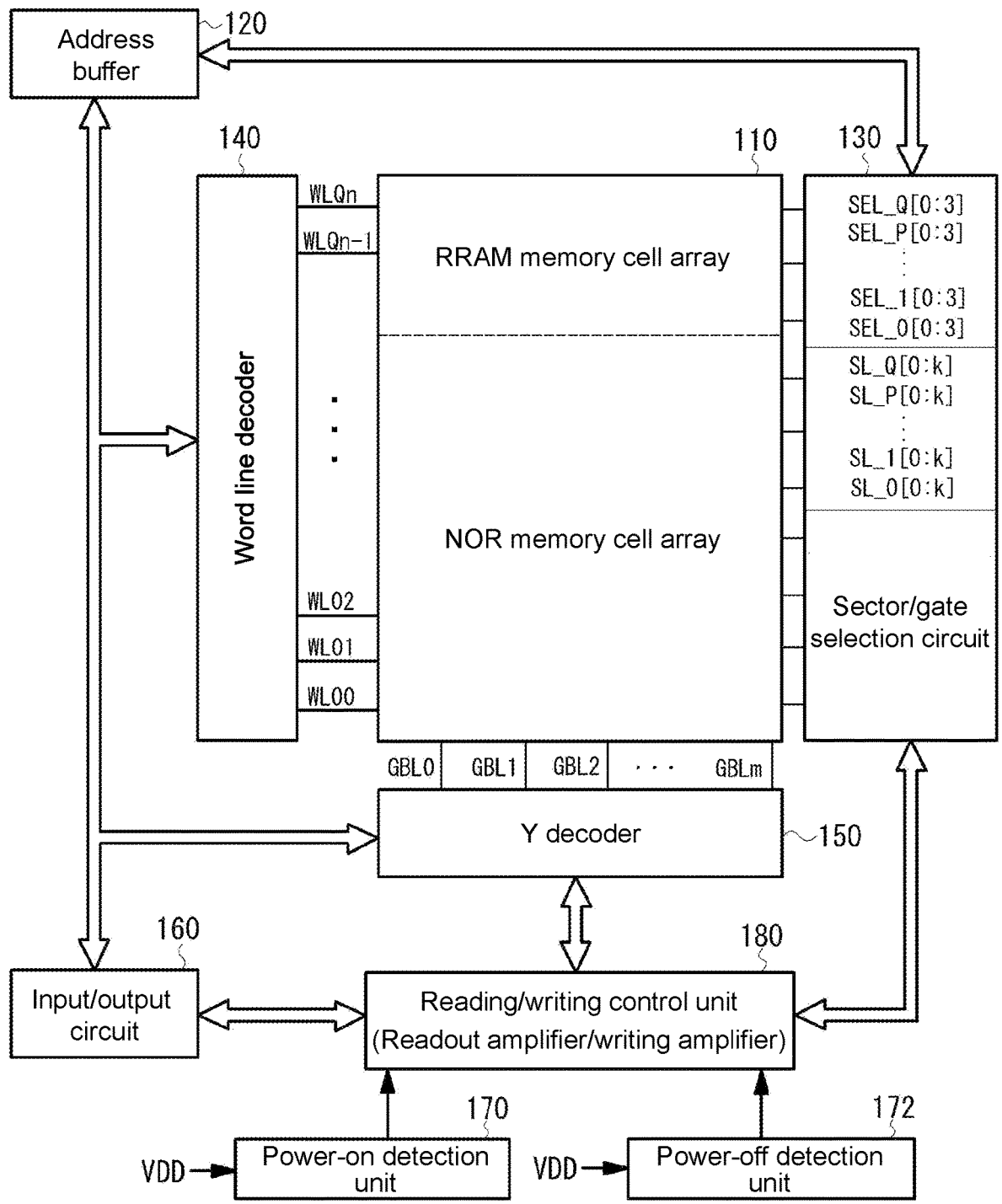
FIG. 1 is a diagram of an overall structure of a non-volatile memory according to an embodiment of the disclosure.

Referring to FIG. 1, a non-volatile memory 100 is formed by, for example, integrating a memory cell array 110, an address buffer 120, a sector/gate selection circuit 130, a word line decoder 140, a Y decoder 150, an input/output circuit 160, a power-on detection unit 170, a power-off detection unit 172, a reading/writing control unit 180, etc. on a substrate such as silicon. The units are connected by an internal bus bar capable of transmitting and receiving addresses, data, and control signals. The figure shows the main structure, and a voltage generation circuit, etc. are omitted.

Figure 2:
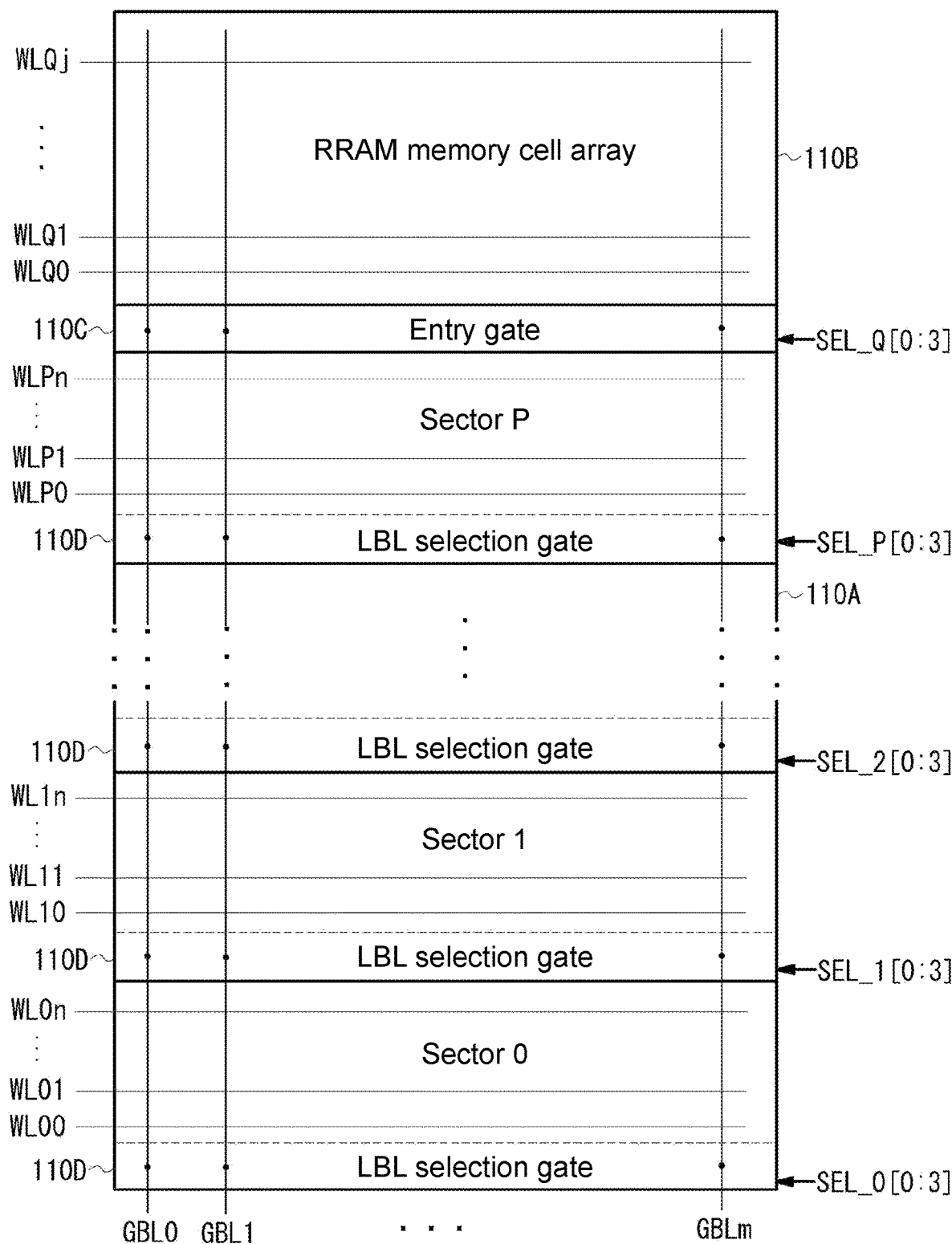
FIG. 2 is a schematic structural diagram of a memory cell array according to an embodiment of the disclosure.

Referring to FIG. 2, the memory cell array 110 includes a first memory cell array (hereinafter referred to as a NOR array) 110A having a NOR flash memory structure and a second memory cell array (hereinafter referred to as a variable resistance array) 110B having a variable resistance memory structure. In comparison with the variable resistance array 110B, the NOR array 110A is capable of achieving high aggregation. In comparison with the NOR array 110A, the variable resistance array 110B is capable of achieving low power operation.

The memory cell array 110 disposes the NOR array 110A and the variable resistance array 110B along a column direction, and a global bit line GBL extends above the NOR array 110A and the variable resistance array 110B along the column direction. The memory size of the NOR array 110A or the variable resistance array 110B is not particularly limited. For example, the NOR array 110A is 16 Mb, and the variable resistance array 110B is 1 Mb.

The NOR array 110A includes a plurality of sectors (or blocks) 0, 1, . . . , P as erasing units along the column direction. Each sector includes a LBL selection gate 110D. The LBL selection gate 110D is used to select a local bit line LBL extending along the column direction in the sector. An entry gate 110C is formed between the last sector P of the NOR array 110A and the variable resistance array 110B. The entry gate 110C selects the local bit line extending along the column direction in the variable resistance array 110B and separates the variable resistance array 110B from the NOR array 110A when the NOR array 110A is accessed.

A plurality of global bit lines GBL0, GBL1, GBL2, . . . , GBLm (collectively referred to as the global bit lines GBL) are formed along the column direction of the memory cell array 110. The global bit lines GBL are connected to the LBL selection gate 110D of each sector of the NOR array 110A and are connected to the entry gate 110C. That is, the global bit lines GBL are shared by the NOR array 110A and the variable resistance array 110B.

A plurality of word lines are formed along a row direction of the memory cell array 110. A word line WL00 to a word line WL0n are formed along the row direction of the sector 0. A word line WL10 to a word line WL1n are formed along the row direction of the sector 1. Similarly, a word line WLP0 to a word line WLPn are formed along the row direction of the sector P. A word line WLQ0 to a word line WLQj are formed along the row direction of the variable resistance array 110B.

The LBL selection gate 110D of the sector 0 is supplied with a 4-bit selection signal line SEL_0[0:3] from the sector/gate selection circuit 130. The LBL selection gate 110D of the sector 1 is supplied with a selection signal line SEL_1[0:3]. Similarly, the LBL selection gate 110D of the sector P is supplied with a selection signal line SEL_P[0:3]. The entry gate 110C is supplied with a selection signal line SEL_Q[0:3]. The sector/gate selection circuit 130 selects the sector of the NOR array 110A by a part of a row address (an upper bit) and supplies a selection signal line to the LBL selection gate 110D corresponding to the selected sector.

Figure 3:
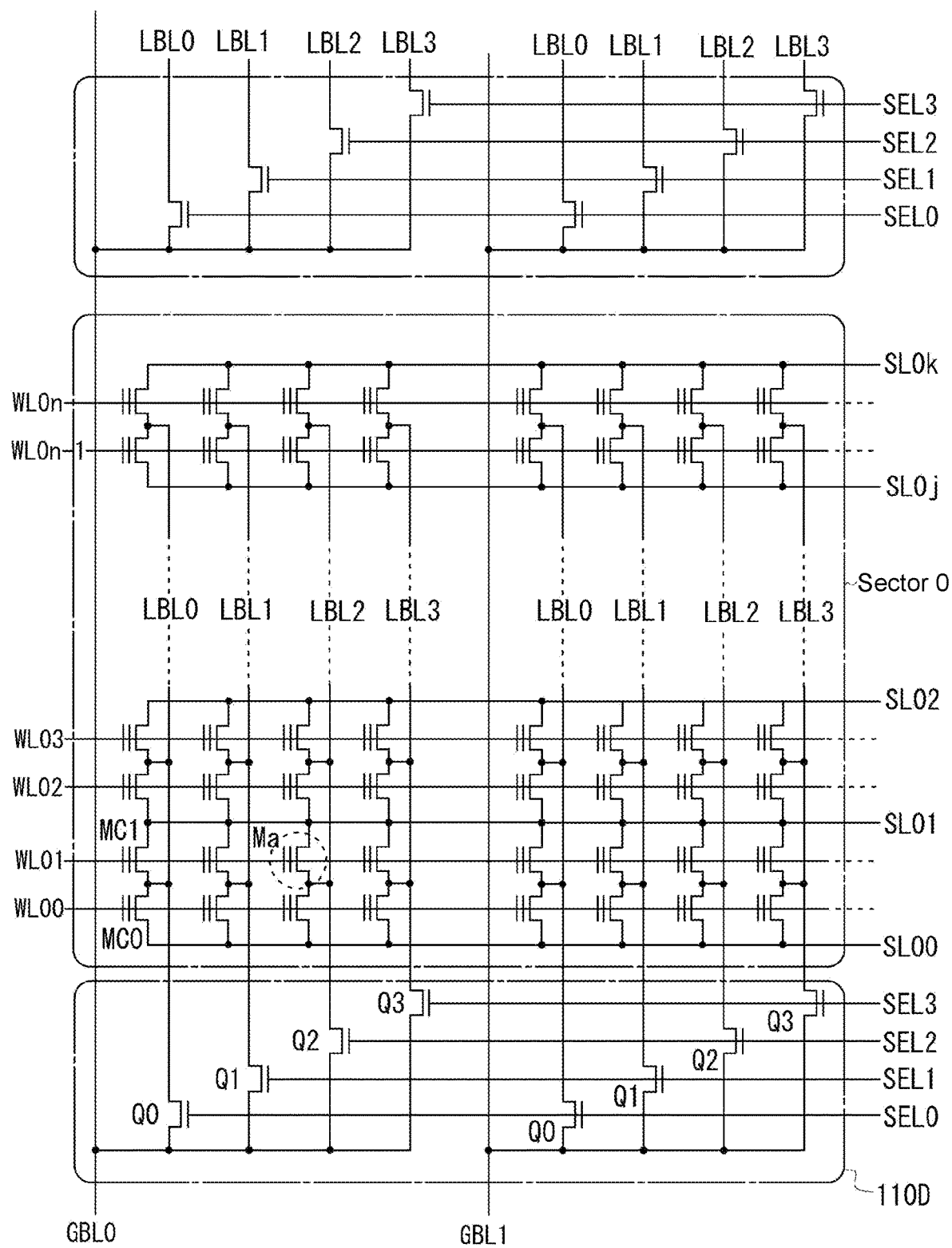
FIG. 3 is a circuit diagram of a part of a NOR memory cell array according to an embodiment of the disclosure.

FIG. 3 shows a circuit structure of a part of the sector 0. The global bit line GBL is divided into four local bit lines LBL0 to LBL3, so that the LBL selection gate 110D extends along the row direction. That is, m global bit lines GBL are divided into m×4 lines by the LBL selection gate 110D.

Between the global bit line GBL and the four local bit lines LBL0 to LBL3, four N-metal oxide semiconductor (NMOS) transistors Q0, Q1, Q2, and Q3 connected in parallel are formed. Each gate of the transistor Q0 is commonly connected with a selection signal line SEL0 extending along the row direction. Each gate of the transistor Q1 is commonly connected with a selection signal line SEL1 extending along the row direction. Each gate of the transistor Q2 is commonly connected with a selection signal line SEL2 extending along the row direction. Each gate of the transistor Q3 is commonly connected with a selection signal line SEL3 extending along the row direction.

The sector/gate selection circuit 130 selects the sector based on the upper bit of the row address and selects the selection signal line connected to the LBL selection gate 110D of the selected sector based on a column address. For example, when the sector 0 is selected, the selection signal line SEL_0[0:3] is selected. The reading/writing control unit 180 drives any one of the selected selection signal lines to the H level, and drives the remaining selection signal lines to the L level. For example, the selection signal line SEL0 is driven to the H level, and the remaining selection signal line SEL1 to selection signal line SEL3 are driven to the L level. As a result, m transistors Q0 of the LBL selection gate 110D are turned on, and m global bit lines GBL are selectively connected to m corresponding local bit lines LBL0. On the other hand, the transistors Q1 to Q3 are turned off, and the local bit line LBL1 to the local bit line LBL3 are separated from the global bit line GBL.

In each sector, a plurality of memory cells are formed in a matrix. A drain region of the adjacent memory cells along the column direction is commonly connected, and the drain region is connected to the local bit lines. In addition, each gate of the memory cells in the row direction is commonly connected to the word line in the row direction, and each source region of the memory cells in the row direction is commonly connected to a source line in the row direction. For example, the gates of a memory cell MC0 and a memory cell MC1 are connected to the word line WL00 and the word line WL01, the common drain region of the memory cell MC0 and the memory cell MC1 is connected to the local bit line LBL0, the source region of the memory cell MC0 is connected to a source line SL00, and the source region of the memory cell MC1 is connected to a source line SL01. The sector/gate selection circuit 130 selects the source line of the sector selected based on the column address and applies an operating voltage to the source line selected by the control of the reading/writing control unit 180.

As an example, a substrate surface of the memory cell may include an oxide-nitride-oxide (ONO) film as an accumulation region for trapping electric charges, and conductive gates such as polysilicon or metal are included on the ONO film. The memory cell, for example, traps hot electrons generated when a current flows between the source/drain regions to the ONO film, thereby performing programming on the data. In addition, electric charges may also be trapped to the ONO film by the Fowler-Nordheim (FN) tunneling. The trapped electric charges may be erased, for example, by FN tunneling or hot hole injection.

Figure 5A:
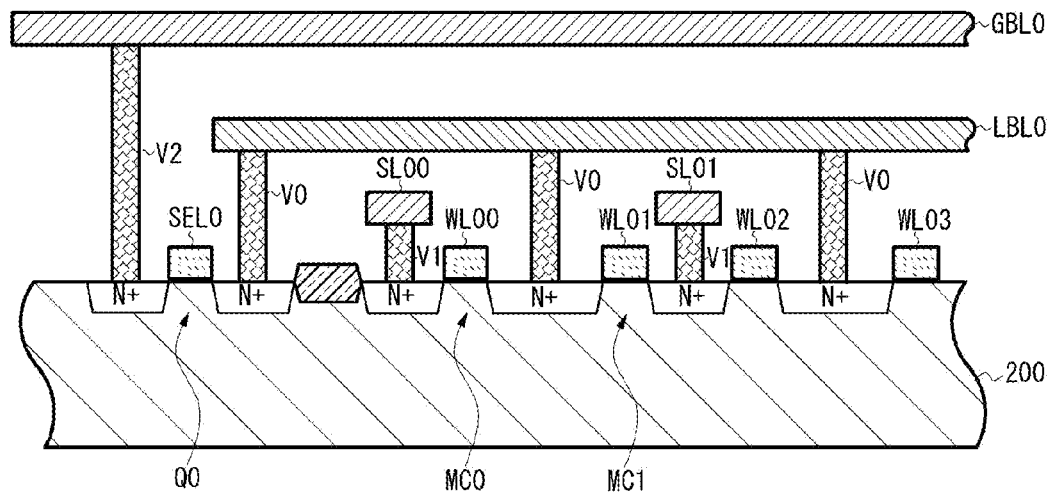
FIG. 5A is a schematic cross-sectional diagram of a NOR memory cell array according to an embodiment of the disclosure.

FIG. 5A shows a schematic cross-section of the column direction of the memory cell MC0 and the memory cell MC1. In a P-type silicon substrate or a P-type well region 200, the memory cell MC0 and the memory cell MC1 are formed in an active region formed by a field oxide film or trench isolation. The gates of the memory cell MC0 and the memory cell MC1 constitute the word line WL00 and the word line WL01 in the row direction. The drain region of the memory cell MC0 and the memory cell MC1 is shared, and the drain region is electrically connected to the local bit line LBL0 in the column direction through a via contact V0. The source regions of the memory cell MC0 and the memory cell MC1 are electrically connected to the source line SL00 and the source line SL01 in the row direction through a contact via V1. In the example, the source line is formed by a conductive layer on the substrate but is not limited hereto, and the source line may also be formed by an embedded diffusion region in the substrate. At this time, each source region of the memory cells in the row direction is commonly connected.

In addition, in the active region adjacent to the memory cell MC0, the transistor Q0 of the LBL selection gate 110D is formed. The gate of the transistor Q0 constitutes the selection signal line SEL0 in the row direction. The drain region is electrically connected to the global bit line GBL0 in the column direction through a contact via V2. The source region is electrically connected to the local bit line LBL0 through the contact via V0.

The local bit lines LBL0 to LBL3 formed by the LBL selection gate 110D are connected to the common drain region of the last memory cell WL0n-1 and the memory cell WL0n of the sector 0 and end here. The other sector 1 to sector P are also constituted in the same manner as the sector 0.

Next, the entry gate 110C is described. As shown in FIG. 2, the entry gate 110C is formed at the boundary between the last sector P of the NOR array 110A and the variable resistance array 110B. The entry gate 110C includes the transistors Q0 to Q3 whose gate width and gate length are the same as the transistors Q0 to Q3 of the LBL selection gate 110D. Unlike the LBL selection gate 110D, the entry gate 110C is connected to the global bit line GBL in a manner of dividing the global bit line GBL into the two local bit lines LBL0 and LBL1.

Figure 4:
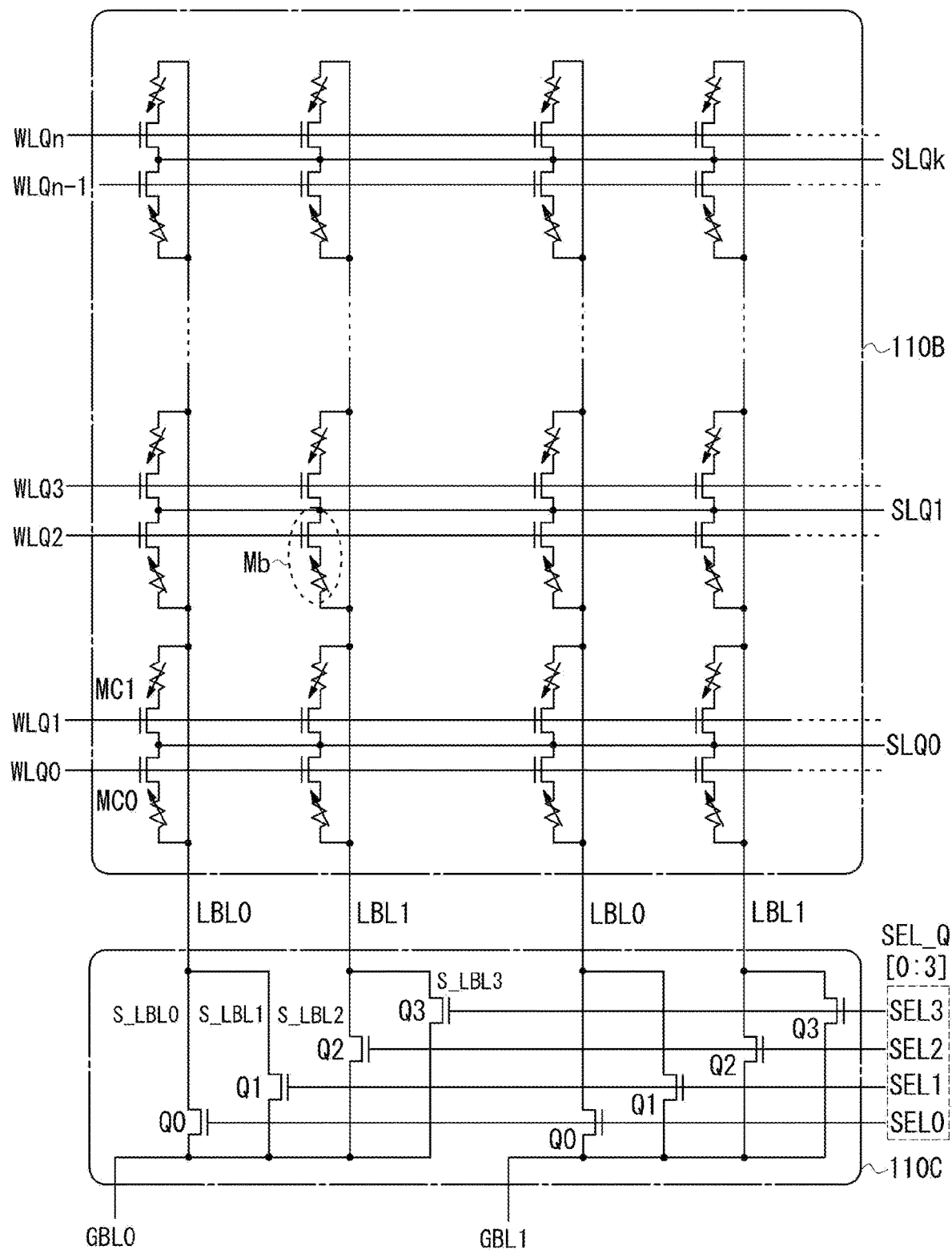
FIG. 4 is a circuit diagram of a part of a variable resistance memory cell array according to an embodiment of the disclosure.

FIG. 4 shows a part of the circuit structure of the entry gate 110C and the variable resistance array 110B. The entry gate 110C includes the transistors Q0 to Q3 connected in parallel between the global bit line GBL and four sacrificial local bit lines S_LBL0 to S_LBL3. The gates of the transistors Q0 to Q3 are connected to the selection signal line SEL_Q[0:3] from the sector/gate selection circuit 130.

By short-circuiting the sacrificial local bit line S_LBL0 and the adjacent sacrificial local bit line S_LBL1, the local bit line LBL0 is formed. By short-circuiting the sacrificial local bit line S_LBL2 and the adjacent sacrificial local bit line S_LBL3, the local bit line LBL1 is formed.

When accessing the NOR array 110A, the reading/writing control unit 180 drives the selection signal line SEL_Q[0:3] to the L level through the sector/gate selection circuit 130, so that all the transistors Q0 to Q3 are turned off and the variable resistance array 110B is separated from the NOR array 110A. In addition, when accessing the variable resistance array 110B, the reading/writing control unit 180 drives any one of the selection signal lines SEL_Q to the H level through the sector/gate selection circuit 130, so that any one of the transistors Q0 to Q3 is turned on and the selected local bit line is connected to the global bit line.

In the embodiment, the spacing between the local bit line LBL0/local bit line LBL1 of the variable resistance array 110B is twice the spacing between the local bit line LBL0/local bit line LBL1 and the local bit line LBL2/local bit line LBL3 of the NOR array 110A. In addition, in the entry gate 110C, two transistors connected in parallel are connected to one local bit line, so the current supplied to the local bit line of the variable resistance array 110B is twice the current supplied to the local bit line of the NOR array 110A. Since the integration degree of the NOR array 110A is higher than the integration degree of the variable resistance array 110B, the spacing between the local bit lines of the variable resistance array 110B is greater than that of the NOR array 110A. The above structure is an example but is not limited hereto. For example, the spacing of the NOR array 110A may also be equal to the spacing of the variable resistance array 110B.

In the variable resistance array 110B, the memory cells are formed in a matrix. The memory cell consists of an access transistor and a variable resistance element. The gate of the access transistor in the row direction is commonly connected to the word line in the row direction. The source region of a pair of adjacent access transistors along the column direction is commonly connected to the corresponding source line. One electrode of the variable resistance element is connected to the drain region of the access transistor. The other electrode of the variable resistance element is connected to the local bit line. For example, the gates of the memory cell MC0 and the memory cell MC1 are connected to the word line WLQ0 and the word line WLQ1, the common source region of the memory cell MC0 and the memory cell MC1 is connected to a source line SLQ0, the drain region of the memory cell MC0 is connected to the local bit line LBL0 through the variable resistance element, and the drain region of the memory cell MC1 is connected to the local bit line LBL0 through the variable resistance element.

The variable resistance element includes, for example, a thin film oxide of transition metal such as hafnium oxide (HfOx) and is set or reset according to the polarity and magnitude of a writing pulse voltage. For example, the variable resistance element is set to a low resistance state when the current flows from the bit line side to the source line side and is reset to a high resistance state when the current flows from the source line side to the bit line side.

Figure 5B:
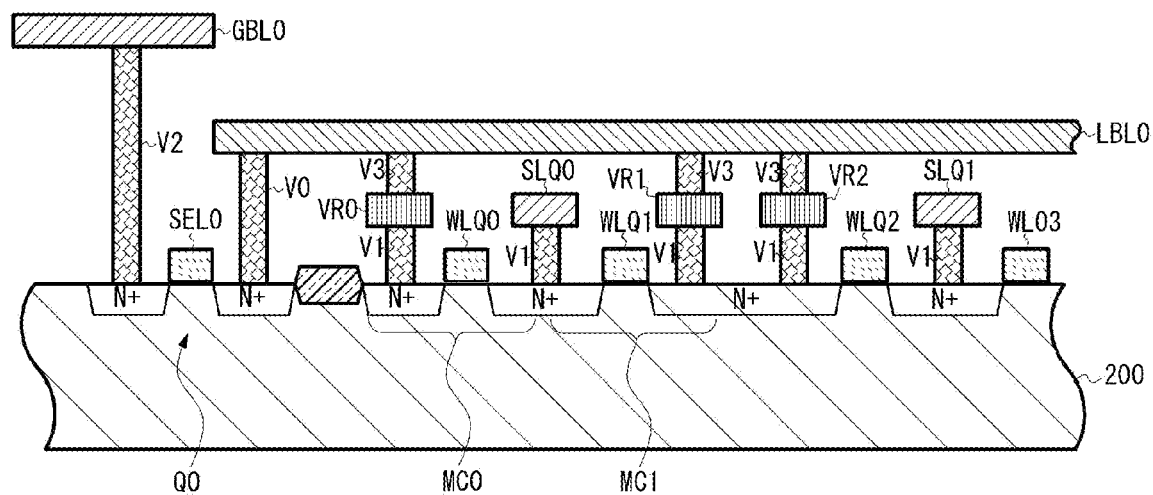
FIG. 5B is a schematic cross-sectional diagram of a variable resistance memory cell array according to an embodiment of the disclosure.

FIG. 5B shows a schematic cross-section of the column direction of the memory cell MC0 and the memory cell MC1 of the variable resistance array 110B. In the P-type silicon substrate or the P-type well region 200, the memory cell MC0 and the memory cell MC1 are formed in the active region formed by the field oxide film or the trench isolation.

The gates of the access transistors of the memory cell MC0 and the memory cell MC1 constitute the word line WLQ0 and the word line WLQ1 in the row direction. The common source region of the access transistors is electrically connected to the source line SLQ0 in the row direction through the contact via V1. The drain region of the access transistor of the memory cell MC0 is connected to a variable resistance element VR0 through the contact via V1, and the variable resistance element VR0 is further electrically connected to the local bit line LBL0 in the column direction through a contact via V3. The drain region of the access transistor of the memory cell MC1 is connected to the variable resistance element VR1 through the contact via V1, and the variable resistance element VR1 is further electrically connected to the local bit line LBL0 through the contact via V3.

In the active region adjacent to the memory cell MC0, the transistor Q0 of the entry gate 110C is formed. The gate of the transistor Q0 forms the selection signal line SEL0 in the row direction. The drain region is electrically connected to the global bit line GBL0 through the contact via V2. The source region is electrically connected to the local bit line LBL0 through the contact via V0.

The memory cell array 110 is formed of a multilayer wiring structure, but as shown in FIG. 5A and FIG. 5B, it can be understood that the variable resistance array 110B and the entry gate 110C have a structure compatible with the NOR array 110A.

Referring again to FIG. 1, the address buffer 120 receives an address from the input/output circuit 160 and provides the received address to the sector/gate selection circuit 130, the word line decoder 140, the Y decoder 150, and the reading/writing control unit 180. The sector/gate selection circuit 130 selects the sector based on the row address, and drives the selection signal line SEL0 to the selection signal line SEL3 corresponding to the sector selected based on the column address with the H level or the L level. Further, the sector/gate selection circuit 130 applies the operating voltage to the source line corresponding to the selected sector based on the column address. The voltage applied to the selection signal line or the source line is controlled by the reading/writing control unit 180.

The Y decoder 150 selects the global bit line GBL0 to the global bit line GBLm based on the column address. The selected global bit line GBL is applied with a reading voltage, a writing (programming) voltage, an erasing voltage, etc., based on the control of the reading/writing control unit 180.

The word line decoder 140 selects the word line of the NOR array 110A based on the row address from the address buffer 120. The selected word line is applied with the voltage corresponding to reading, writing (programming), and erasing based on the control of the reading/writing control unit 180. When all the data of the memory cells in the sector of the NOR array 110A are erased, all the word lines in the sector are selected. In addition, when accessing the variable resistance array 110B, the row address is supplied from the reading/writing control unit 180 to the word line decoder 140, and the word line decoder 140 selects the word line of the variable resistance array 110B based on the row address. The selected word line is applied with the voltage corresponding to reading and writing based on the control of the reading/writing control unit 180.

The input/output circuit 160 receives a command or data from an external host computer, or outputs data read from the memory cell array 110 to the outside. The received address is provided to the address buffer 120, and the data or command to be written is provided to the reading/writing control unit 180.

The power-on detection unit 170 detects a power-on level when a power supply voltage VDD (including a battery) is externally turned on and provides the detection result to the reading/writing control unit 180. The reading/writing control unit 180 executes a power-on sequence when the power-on level is detected, for example, by reading setting information from a pre-prepared storage region and adjusting the operation parameters of the circuit unit based on the setting information. In addition, as described later, the power-on sequence of the embodiment has a recovery function of reading data written into the variable resistance array 110B and writing the read data into the NOR array 110A.

The power-off detection unit 172 detects whether the power supply voltage VDD has fallen to the power-off level and provides the detection result to the reading/writing control unit 180. For example, when the power supply voltage VDD momentarily stops due to a power failure, temporarily drops due to a peak current consumption, or drops due to a decrease in the remaining battery capacity when the power supply source is a battery, the power-off level may be detected. If the power-off level is detected, the reading/writing control unit 180 performs a power-off operation, such as stopping an operation of a charge pump circuit action or resetting a central processing unit (CPU) or a logic circuit. In addition, as described later, the power-off operation of the embodiment has a function of writing the unwritten data into the variable resistance array 110B to prevent the unwritten data from disappearing when data is written into the NOR array 110A.

The reading/writing control unit 180 includes, for example, a microcontroller, a readout amplifier S/A, a writing amplifier W/A, etc. and controls the overall operation of the non-volatile memory 100. The reading/writing control unit 180 decrypts the command received from the input/output circuit 160 and performs reading, writing, and erasing based on the decryption result.

Reading Operation

When a reading command and address are input from the outside, the word line decoder 140 selects the word line of the NOR array 110A based on the row address. The sector/gate selection circuit 130 selects the selection signal line SEL0 to the selection signal line SEL3 of the LBL selection gate 110D corresponding to the sector selected based on the row address and selects the source line SL based on the column address. The Y decoder 150 selects the global bit line based on the column address. During the period of accessing the NOR array 110A, the reading/writing control unit 180 sets the entry gate 110C as non-selected (the selection signal line SEL0 to the selection signal line SEL3 are all at the L level), so that the variable resistance array 110B is separated from the NOR array 110A.

For example, referring to FIG. 3, when a memory cell Ma of the NOR array 110A is selected, the reading voltage is applied to the selected word line WL01, and the ground (GND) is supplied to the source line SL01. In addition, the selection signal line SEL2 is driven to the H level, the transistor Q2 is turned on, the global bit line GBL0 is selected by the Y decoder 150, and the reading voltage is applied to the global bit line GBL0 by the reading/writing control unit 180. The memory cell Ma is turned on/off according to stored data "0" or stored data "1", and the readout amplifier senses the voltage or the current of the global bit line GBL0.

In addition, referring to FIG. 4, when a memory cell Mb of the variable resistance array 110B is selected, the reading voltage is applied to a selected word line WLQ2, the access transistor is turned on, and the GND is supplied to a source line SLQ1 selected by the sector/gate selection circuit 130. In addition, the selection signal line SEL2 of the entry gate 110C is driven to the H level, the transistor Q2 is turned on, the global bit line GBL0 is selected by the Y decoder 150, and the reading voltage is applied to the global bit line GBL0 by the reading/writing control unit 180. According to whether the variable resistance element is in the low resistance state or the high resistance state, the current flowing from the global bit line GBL0 to the source line SLQ1 is different, and the readout amplifier senses the voltage or the current.

Writing Operation

The reading/writing control unit 180 performs writing into the NOR array 110A according to a writing command, an address, and data input from the outside. For example, when the data "0" is written into the memory cell Ma of the NOR array 110A, a writing voltage is applied to the selected word line WL01 and the selected global bit line GBL0, and the GND is applied to the selected source line SL01.

When the data "0" is written into the memory cell Mb of the variable resistance array 110B, the writing voltage is applied to the selected word line WLQ2 so that the access transistor is turned on, the writing voltage is applied to the selected global bit line GBL0, and the GND is applied to the selected source line SLQ1. When the data "1" is written into the memory cell Mb, the GND is applied to the global bit line, and the writing voltage is applied to the source line.

Erasing Operation

The reading/writing control unit 180 performs erasing on the data of the memory cells of the NOR array 110A according to an erasing command and address input from the outside. When erasing is performed on the sector of the NOR array 110A, all word lines in the sector are selected, and the GND is applied to the selected word lines. In addition, the sector/gate selection circuit 130 sets all the transistor Q0 to the transistor Q3 of the selected LBL selection gate 110D as turned off, sets the local bit line LBL0 to the local bit line LBL3 to a floating state, and applies the erasing voltage to all source lines in the selected sector. As a result, a high voltage is applied to the gate and source regions of all memory cells in the sector. The electrons in the memory cells escape to a source side. The threshold value of the memory cells drops, and the data becomes "1".

Next, recovery of a momentary stop or a fluctuation of the power supply voltage VDD during writing into the NOR array 110A is described. During writing into the NOR array 110A, when a power-off is detected by the power-off detection unit 172, the reading/writing control unit 180 is capable of writing the unwritten data into the variable resistance array 110B during dropping of the power supply voltage VDD. After that, when the power supply voltage VDD is restored and the power-on detection unit 170 detects a power-on, the unwritten data written into the variable resistance array 110B is read in the power-on sequence, and the read unwritten data is written into the NOR array 110A. As a result, interrupted writing is recovered.

Figure 6:
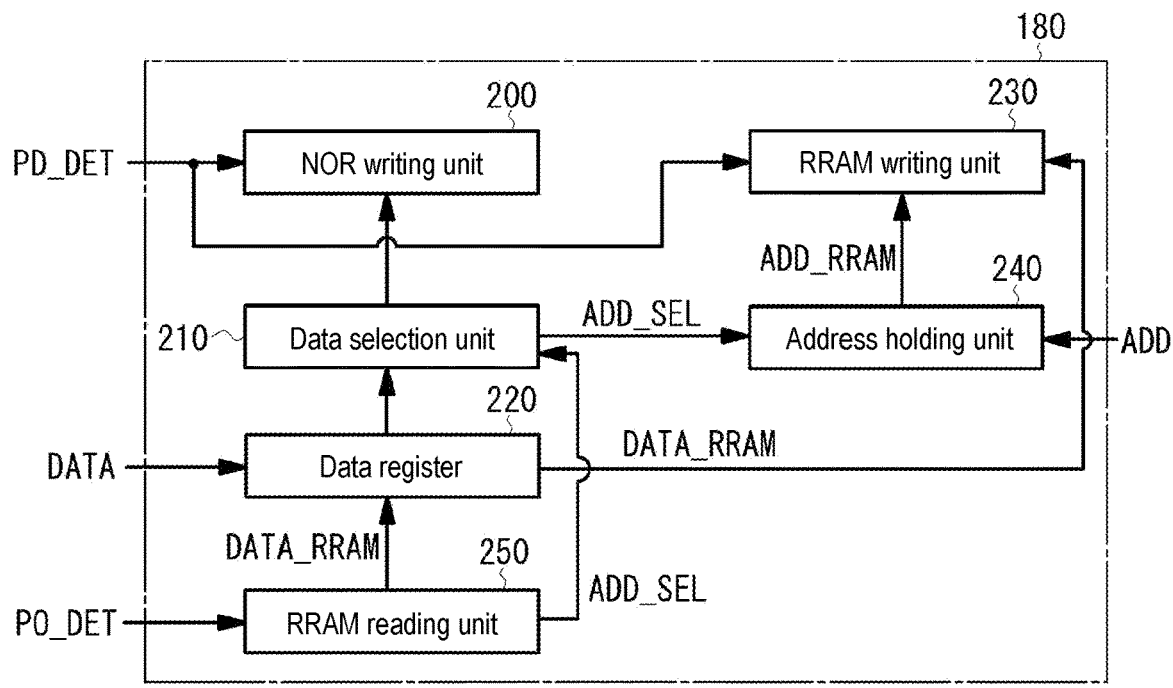
FIG. 6 is a diagram of a structure of a reading/writing control unit according to an embodiment of the disclosure.

FIG. 6 is a diagram of a structure associated with the recovery function of the reading/writing control unit 180 of the embodiment. The reading/writing control unit 180 includes: a NOR writing unit 200, controlling writing into the NOR array 110A; a data selection unit 210, selecting the data to be written into the selected memory cell in the NOR array 110A; a data register 220, holding data DATA received through the input/output circuit 160 or unwritten data DATA_RRAM read by a RRAM reading unit 250; a RRAM writing unit 230, controlling writing into the variable resistance array 110B; an address holding unit 240, holding an address ADD received through the input/output circuit 160 and an address ADD_SEL indicating the position of the data selected by the data selection unit 210; and the RRAM reading unit 250, reading data for recovery from the variable resistance array 110B.

When writing into the NOR array 110A is performed, the data DATA input through the input/output circuit 160 is held in the data register 220, and the address ADD is held in the address holding unit 240. In addition to writing, for example, in units of bits, byte writing in units of bytes or page writing in units of pages can also be performed. Byte writing or page writing may be specified according to the writing command. Byte writing or page writing is capable of achieving continuous data writing to the same row of the NOR array 110A. The word line decoder 140 selects the word line based on the input row address, and the Y decoder 150 selects the global bit line based on the input column address. The selection method of the bit line for page writing or byte writing is not particularly limited. For example, the address for specifying the start address and the end address of the page or the byte may be input, or only the start address is specified and the subsequent address is generated, for example, by an address counter. In the latter case, the Y decoder 150 sets the input column address in the address counter, and then increments the address counter by an internal clock signal, thereby generating the column address.

The data register 220 includes, for example, a latch circuit capable of holding one page of data. In byte writing, input byte data is held in the data register 220, and in page writing, the input page data is held in the data register 220.

The data selection unit 210 selects the data held in the data register 220 and provides the selected data to the NOR writing unit 200. The data selection unit 210 includes, for example, a counter or an address index specifying the address of the data register 220 and selects data at the specified address. For example, if the NOR array has the structure shown in FIG. 3, the data may be written into the memory cells at the same time, and in this case, a plurality of data may be selected at the same time.

The NOR writing unit 200 generates a writing bias voltage corresponding to the data "0" or the data "1" selected by the data selection unit 210. As a result, data is written into the selected memory cells. In page writing, the page data held in the data register 220 is written into the memory cell of the selected page (e.g., the memory cell connected to the word line WL00) in the NOR array 110A. In addition, the data selection unit 210 provides the address data ADD_SEL indicating the position of the selected data to the address holding unit 240.

When the power supply voltage VDD drops to the power-off level during the writing operation to the NOR array 110A, the NOR writing unit 200 interrupts the writing operation to the NOR array 110A in response to a power-off detection signal PD_DET from the power-off detection unit 172. On the other hand, the RRAM writing unit 230 writes the unwritten data into the variable resistance array 110B in response to the detection signal PD_DET.

The RRAM writing unit 230 provides the internally generated row address and column address to the word line decoder 140, the Y decoder 150, and the sector/gate selection circuit 130. The row address and the column address are generated for writing the unwritten data into a predetermined region of the variable resistance array 110B. The word line decoder 140 selects the word line of the variable resistance array 110B based on the row address, and the Y decoder 150 selects the global bit line GBL based on the column address. In addition, the sector/gate selection circuit 130 selects a source line SLQ of the variable resistance array 110B based on the column address and further selects the selection signal line SEL_Q for enabling the entry gate 110C. The transistor Q0 to the transistor Q3 of the entry gate 110C are turned on/off by the selection signal line SEL_Q and select the local bit line connected to the global bit line.

In this way, the memory cell (variable resistance element) of the variable resistance array 110B is selected. The RRAM writing unit 230 applies a bias voltage for setting writing or resetting writing to the selected memory cell according to the written data "0" or data "1" through the global bit line GBL and the source line.

The RRAM writing unit 230 writes the unwritten data DATA_RRAM held in the data register 220 and address data ADD_RRAM held in the address holding unit 240 into the predetermined region of the variable resistance array 110B. Further, the writing command (or data identifying byte writing or page writing) to the NOR array 110A is written along with the unwritten data. The unwritten data DATA_RRAM is the data not written into the NOR array 110A when the writing operation is interrupted, that is, the data not selected by the data selection unit 210. In addition, the address data ADD_RRAM includes the address ADD externally input through the input/output circuit 160 for writing into the NOR array 110A and the address ADD_SEL indicating the position of the data selected by the data selection unit 210.

Writing into the NOR array 110A requires applying the high voltage to the selected word line, etc., and a voltage above the power-off level guarantees such writing. On the other hand, writing into the variable resistance array 110B requires a sufficiently low writing voltage as compared to that required for the NOR array 110A. Even if the power supply voltage VDD drops below the power-off level, writing can be performed using such a voltage. Therefore, the unwritten data DATA_RRAM and the address data ADD_RRAM of the NOR array 110A are implemented using a voltage between the power-off level and the minimum voltage that becomes the writing limit of the variable resistance array 110B.

When the power supply voltage VDD is restored, the RRAM reading unit 250 reads the unwritten data DATA_RRAM and the address data ADD_RRAM from the predetermined region of the variable resistance array 110B in response to a power-on detection signal PO_DET from the power-on detection unit 170.

The read unwritten data DATA_RRAM is sent to the data register 220 and is set in the data register 220 according to the address ADD_SEL of the unwritten data to be in the state before writing is interrupted. In addition, the read address ADD_SEL is provided to the data selection unit 210, and the data selection unit 210 selects the data from the data register 220 based on the address ADD_SEL and provides the selected data to the NOR writing unit 200. Further, the read address ADD is provided to the NOR writing unit 200, and the NOR writing unit 200 provides the row address and the column address to the word line decoder 140, the Y decoder 150, and the sector/gate selection circuit 130. In addition, when the writing command to the NOR array 110A or the data identifying the command is written into the variable resistance array 110B, the read writing command or the identified data is provided to the NOR writing unit 200.

In this way, the writing state before the writing is interrupted is restored, and the NOR writing unit 200 may resume the writing of the interrupted NOR array 110A.

Figure 7:
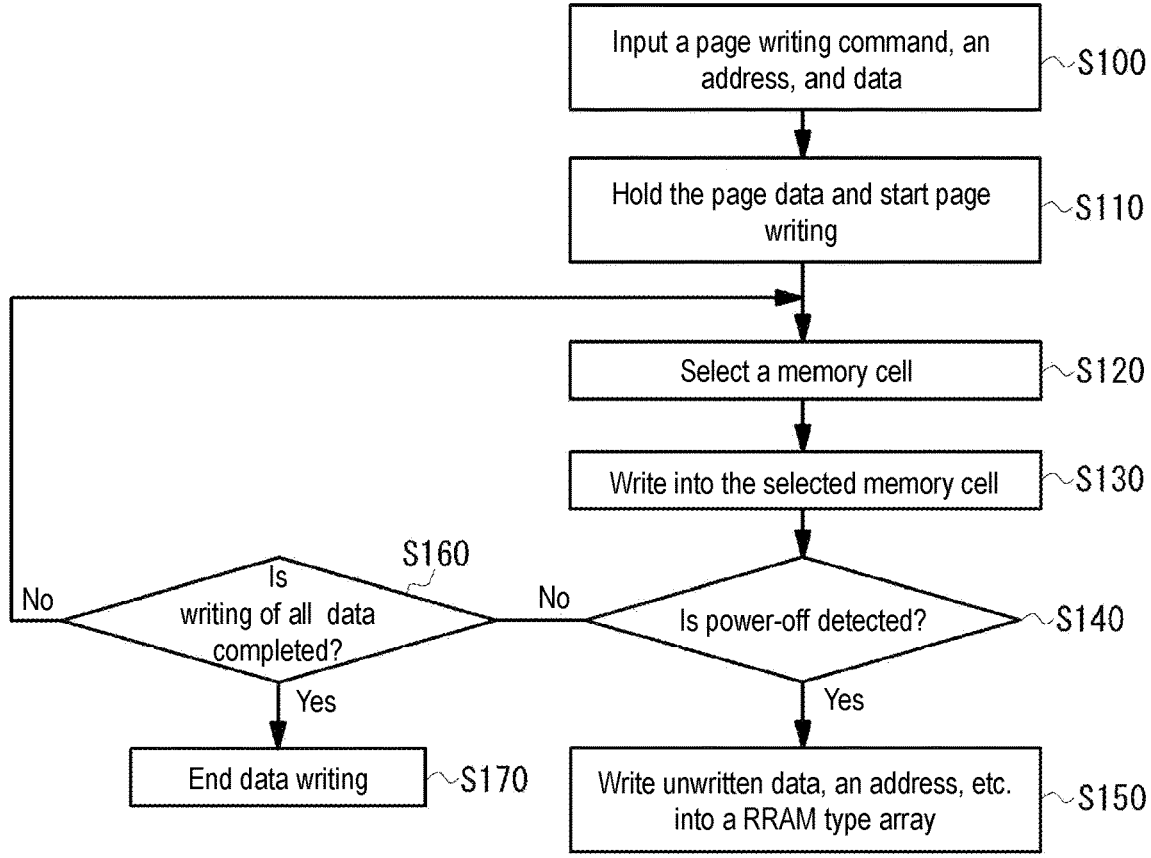
FIG. 7 is a flowchart describing a recovery operation of written data during a power-off detection according to an embodiment of the disclosure.

FIG. 7 is a flowchart describing a recovery operation when the power-off occurs during writing into a NOR array. Here, writing is assumed to be page writing. The page writing command, the address, and the page data output from the host computer are received through the input/output circuit 160 (S100). The reading/writing control unit 180 holds the page data in the data register 220, decrypts the page writing command, and starts the page writing operation (S110). The NOR writing unit 200 selects the memory cell of the selected page according to the address (S120) and writes the page data into the selected memory cell (S130). For example, in the array structure shown in FIG. 3, multiple data are selected, and the selected data are written into multiple selected memory cells at the same time.

When the power-off detection signal PD_DET is received during writing (S140), the NOR writing unit 200 interrupts writing into the NOR array 110A, instead, the RRAM writing unit 230 writes the unwritten data, the address, etc. into the predetermined region of the variable resistance array 110B (S150). On the other hand, when the power-off is not detected during writing (S140), step S120 to step S140 are repeated to write all the page data held in the data register 220 into the selected page (S160, S170).

Figure 8:
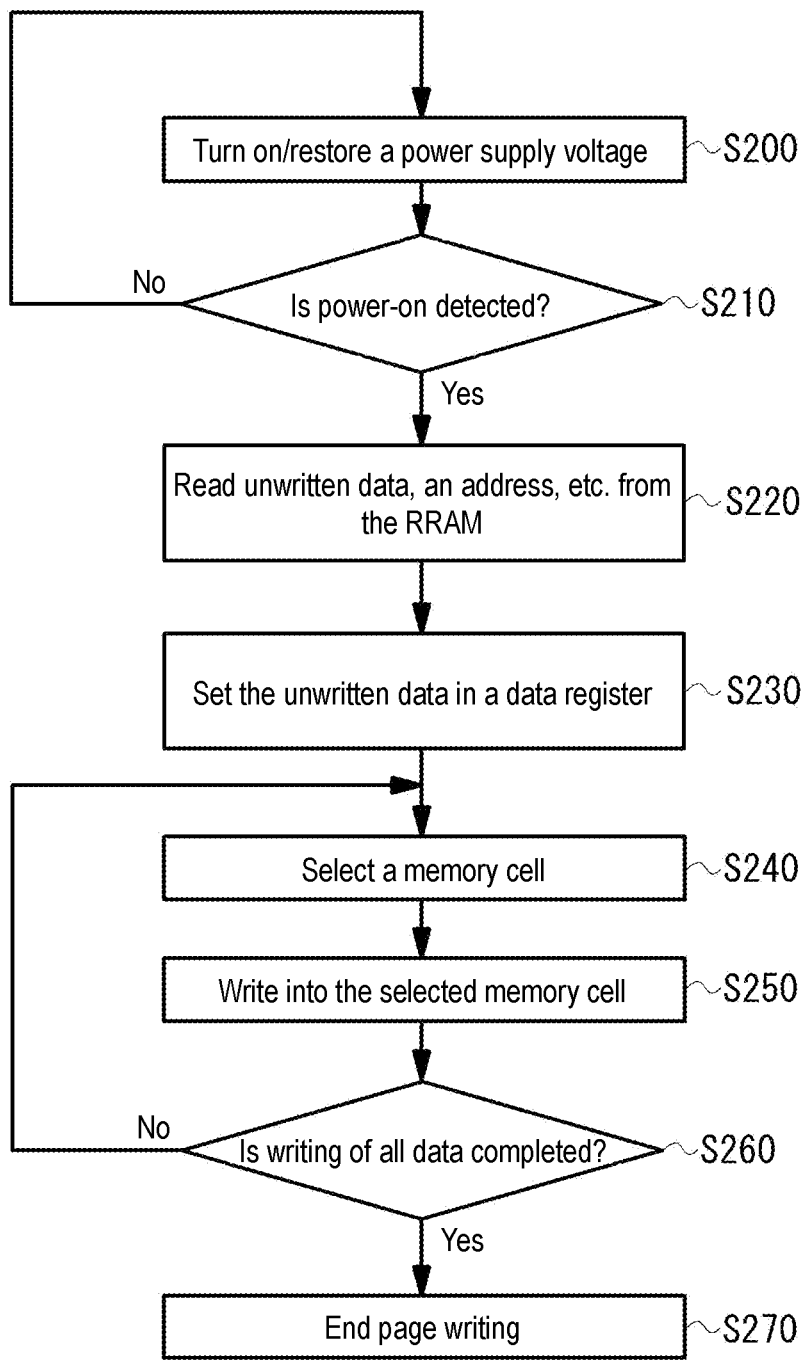
FIG. 8 is a flowchart describing a recovery operation of written data during a power-on detection according to an embodiment of the disclosure.

FIG. 8 is a flowchart describing an operation when the unwritten data written into the variable resistance array is recovered to the NOR array during power-on. When the power supply voltage VDD is connected/restored to the non-volatile memory 100 (S200), the power-on level is detected by the power-on detection unit 170 (S210). In response to the detection signal PO_DET, the RRAM writing unit 230 reads the unwritten data, the address, etc., from the predetermined region of the variable resistance array 110B (S220). The read unwritten data is set in the data register 220 (S230), and the data selection unit 210 provides the unwritten data to the NOR writing unit 200. The NOR writing unit 200 selects the memory cell according to the read address (S240) and writes the unwritten data into the selected memory cell (S250). Step S240 and step S250 are repeated until writing of all the unwritten data is completed (S260, S270).

Figures 9A, 9B:
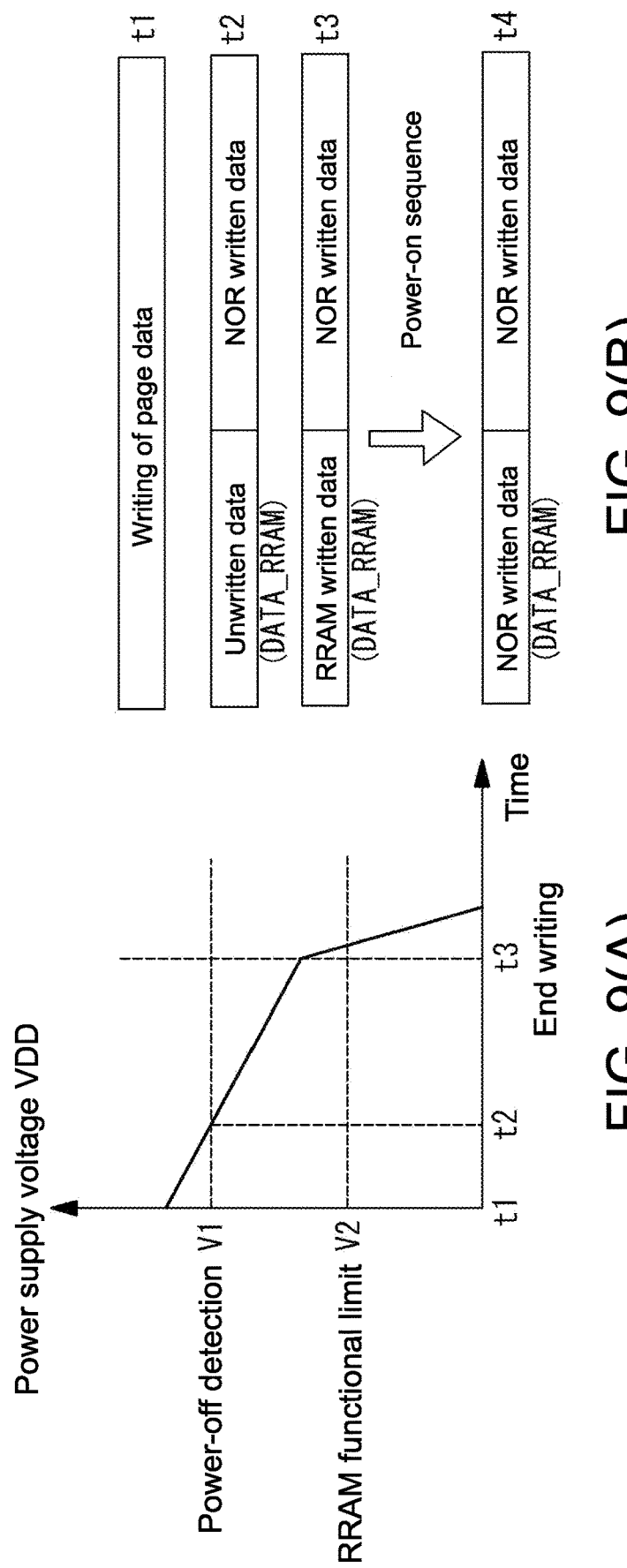
FIG. 9A and FIG. 9B are diagrams of a recovery example of page data during page writing according to an embodiment of the disclosure.

FIG. 9A and FIG. 9B are diagrams showing an example of the recovery operation of page writing when page writing is interrupted. FIG. 9A is a graph showing the relationship between the power supply voltage VDD and writing time, and FIG. 9B shows an example of a transition of the page data.

The page data is input at time t1, and the page data is held in the data register 220. At time t2, the power supply voltage VDD drops to a voltage V1, and a power-off is detected. At this time, a part of the page data is written into the NOR array 110A, and the remaining is the unwritten data DATA_RRAM. At time t2, writing to the NOR array 110A requiring the high voltage for writing is interrupted, and the unwritten data DATA_RRAM, the address ADD_RRAM, etc. are written into the variable resistance array 110B that can write at a lower voltage.

Until the power supply voltage VDD reaches a functional limit voltage V2 of the variable resistance array 110B, writing of the unwritten data, etc. into the variable resistance array 110B is performed and is completed at time t3. Then, the power supply voltage VDD is turned on or restored. When the power-on sequence is executed at time t4, the unwritten data read from the variable resistance array 110B is written into the NOR array 110A.

In this way, even when page writing to the NOR array 110A is interrupted, page writing may be automatically reset without the page data disappearing. As a result, page writing does not need to be executed again by the host computer, thereby reducing the load on the system. In addition, by matching the NOR array 110A with the variable resistance array 110B, the advantage of high aggregation brought by the NOR array 110A and the advantage of low power operation brought by the variable resistance array 110B can be combined.

Furthermore, writing of the unwritten data into the variable resistance array 110B needs to be implemented between a power-off detection level V1 and the functional limit voltage V2 of the variable resistance array 110B. Ideally, the voltage V1 is set by taking into account writing time or power consumption required for writing of the unwritten data. In addition, the above-mentioned embodiment exemplifies page writing but is not limited hereto and may also be applicable to byte writing or multi-bit writing.

In the embodiment, the LBL selection gate 110D divides one global bit line into the four local bit lines, but this is only an example. The number of the local bit lines divided from one global bit line is arbitrary. In addition, the spacing between the local bit lines divided by the entry gate 110C is set to be twice the spacing between the local bit lines divided by the LBL selection gate 110D, but this is only an example, and the ratio of the spacings of the two is arbitrary.

In a first embodiment, the variable resistance array 110B is formed at the farthest end of the NOR array 110A. However, in a second embodiment of the disclosure, the variable resistance array 110B is constituted by one page (one word line), and the variable resistance array 110B is disposed below the Y decoder 150.

Figure 10:
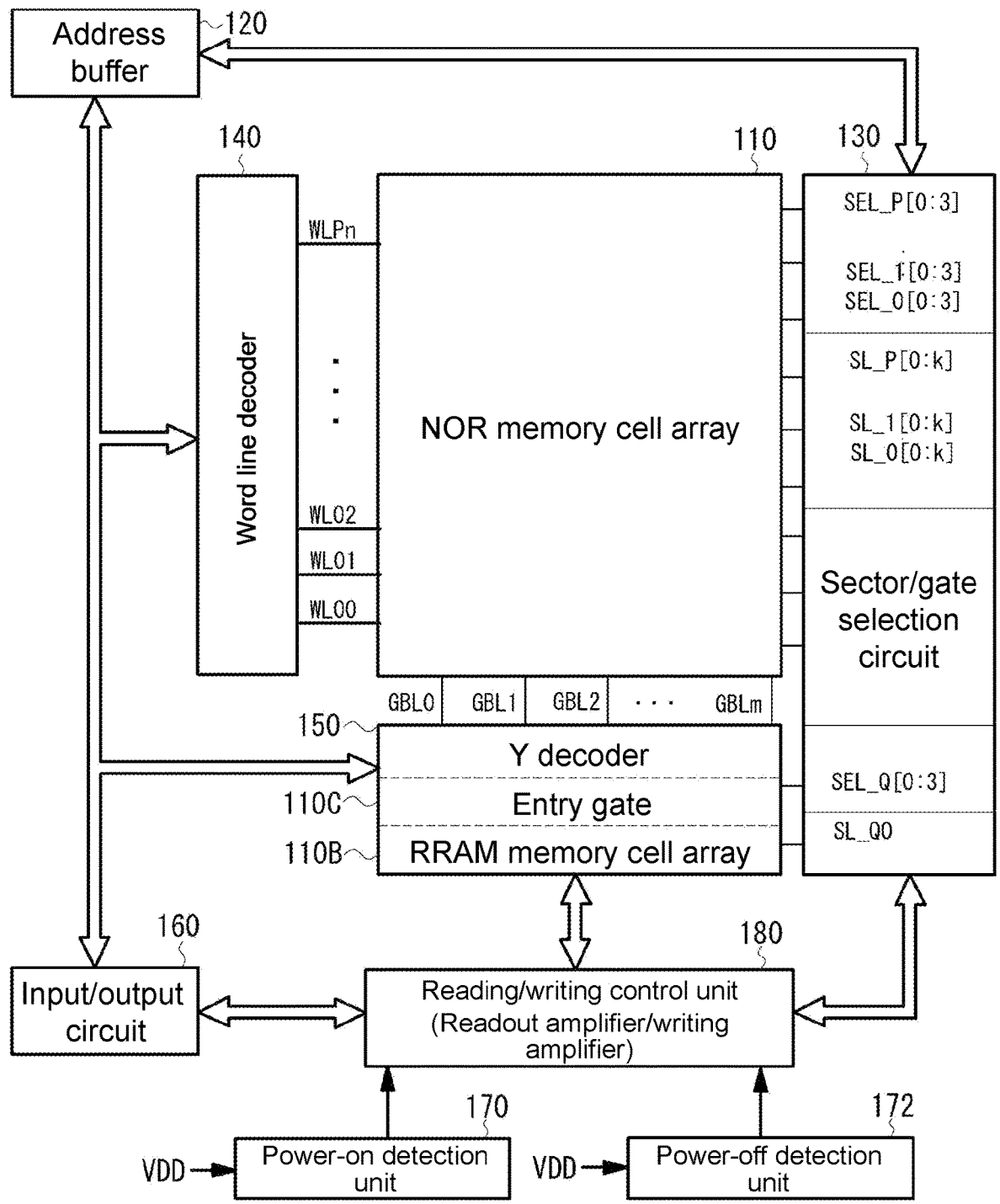
FIG. 10 is a diagram of a structure of a non-volatile memory according to a second embodiment of the disclosure.

FIG. 10 is a diagram showing a structure of a non-volatile memory 100A of the second embodiment, and the same reference numerals are assigned to the same structures as those shown in FIG. 1. As shown in the figure, the Y decoder 150 includes a circuit for selecting the global bit line of the NOR array 110A based on the column address and the entry gate 110C for selecting the local bit line of the variable resistance array 110B based on the selection signal line SEL_Q. In addition, the variable resistance array 110B is formed below the Y decoder 150, and the reading/writing control unit 180 actually accesses the memory cell of the variable resistance array 110B without using the global bit line.

The reading/writing control unit 180 is the same as in the first embodiment. In response to the power-off detection signal PD_DET from the power-off detection unit 172, the unwritten data of the data register 220 is written into the selected memory cell of the variable resistance array 110B through the entry gate 110C. In this case, since there is only one word line in the variable resistance array 110B, selection/driving of the word line may be performed directly by the reading/writing control unit 180 without using the word line decoder 140.

After that, when the power-on sequence is executed in response to the power-on detection signal PO_DET from the power-on detection unit 170, the reading/writing control unit 180 reads the unwritten data from the variable resistance array 110B, and writes the read unwritten data into the remaining memory cells of the corresponding page in the NOR array 110A.

In this way, according to the embodiment, since the variable resistance array 110B is disposed below the Y decoder 150, the reading/writing control unit 180 may access the memory cell of the variable resistance array 110B without substantially using the global bit line extending on the NOR array 110A. As a result, wiring resistance and parasitic capacitance is reduced when writing into the memory cell of the variable resistance array 110B after a power-off detection, so that the unwritten data may be written into the variable resistance array 110B in a short time with less power consumption.

In addition, the variable resistance array 110B includes one page, which is repeatedly used for writing the unwritten data. The variable resistance element has a sufficiently higher endurance (the number of times that can be rewritten) than the NOR memory element and can therefore be used repeatedly. As a result, the space occupied by the variable resistance array is reduced, thereby achieving miniaturization of the memory cell array.

Next, a third embodiment of the disclosure replaces the NOR array 110A of the second embodiment with a NAND array. When the power-off is detected during writing into the NAND array, the page data held in the page buffer is backed up to the variable resistance array.

Figure 11:
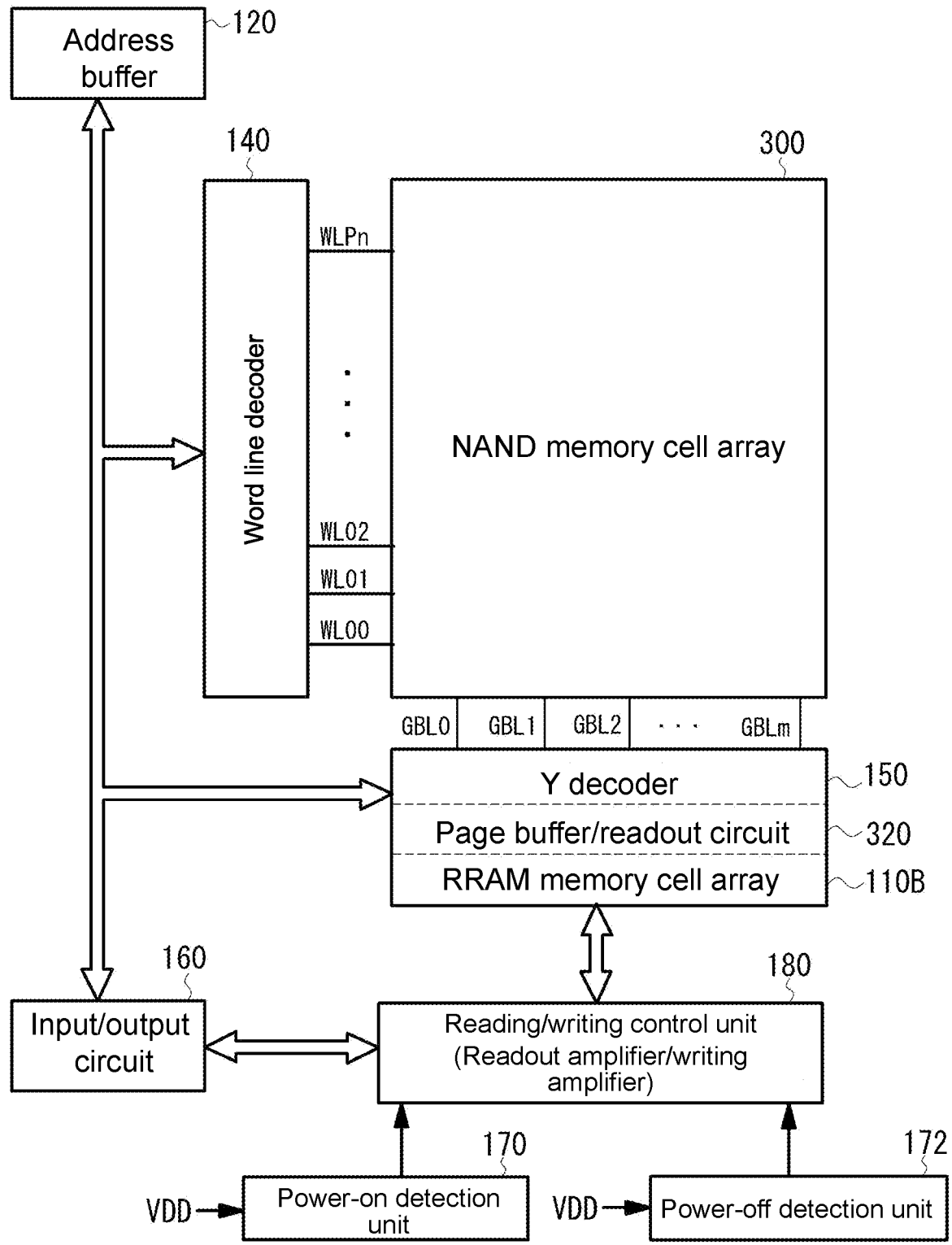
FIG. 11 is a diagram of a structure of a non-volatile memory according to a third embodiment of the disclosure.
Figure 12:
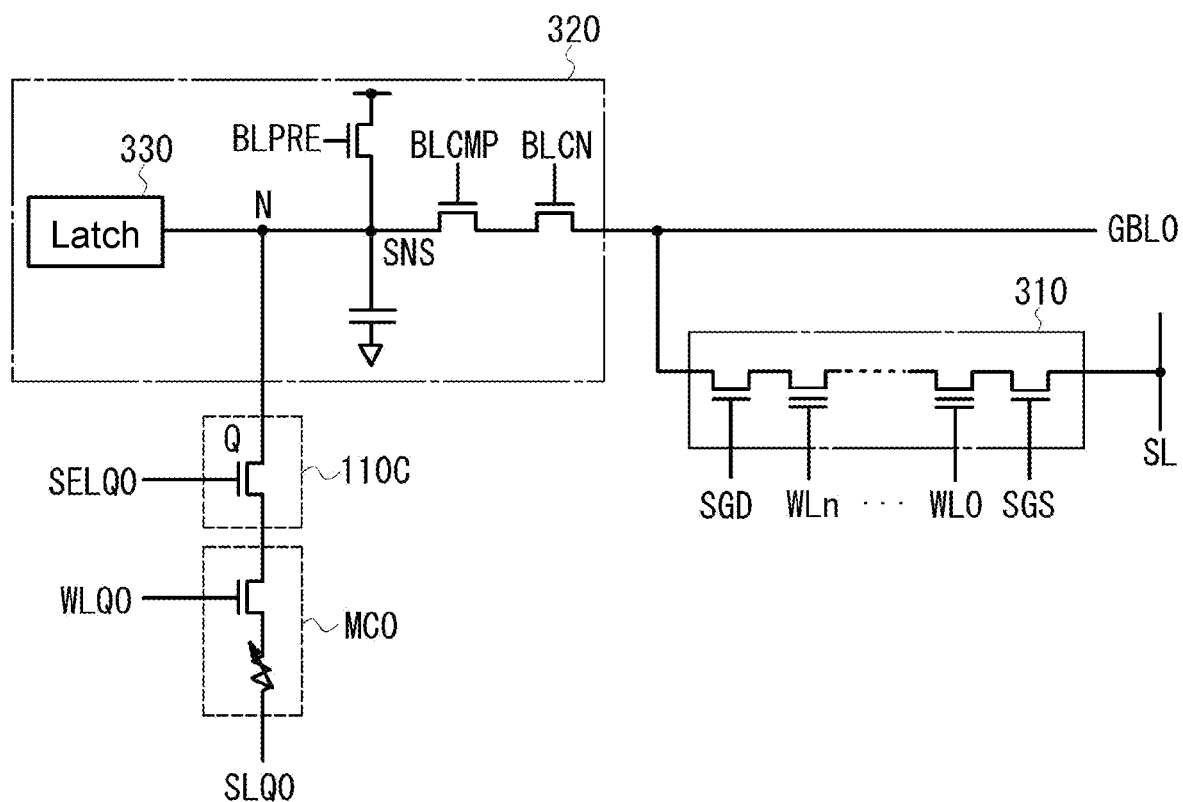
FIG. 12 is a diagram of a connection relationship between a page buffer/readout circuit and a variable resistance array according to a third embodiment of the disclosure.

FIG. 11 is a diagram showing a schematic structure of a non-volatile memory 100B of the third embodiment of the disclosure. FIG. 12 shows the connection relationship between the page buffer/readout circuit and the variable resistance array. A NAND array 300 includes a plurality of NAND strings 310 connected to each of the global bit lines GBL. The NAND string 310 includes a bit line side selection transistor SGD connected to the global bit line, the memory cells connected to the word lines WL0 to WLn, and a source line side selection transistor SGS connected to the common source line SL.

A page buffer/readout circuit 320 includes a precharge transistor BLPRE, a clamp transistor BLCMP, a bit line connection transistor BLCN, etc., for precharging the selected bit line or performing data sensing on the selected memory cell. The page buffer/readout circuit 320 also includes a latch 330. The latch 330 holds data sent from a readout node SNS or data received from the input/output circuit 160 during writing. Although the latch 330 holding 1-bit data is shown in FIG. 12, the latch 330 holds one page of data.

The variable resistance array 110B includes one page (one word line) and is disposed below the page buffer/readout circuit 320. As shown in FIG. 12, a transistor Q serving as an entry gate 110C is connected to a node N of the latch 330, and a selection signal line SELQ0 is connected to the gate of the transistor Q. In addition, the memory cell MC0 is connected in parallel to the transistor Q. The memory cell MC0 includes the access transistor and the variable resistance element, the word line WLQ0 is connected to the gate of the access transistor, and the source line SLQ0 is connected to one terminal of the variable resistance element.

The transistor Q includes a transistor for withstanding high pressure. The transistor is turned off when the NAND array 300 is accessed and is turned on when the unwritten data is written into the memory cell MC0. In this way, the memory cell MC0 is protected from the influence of high voltage, etc. applied to the NAND array 300.

The reading/writing control unit 180 reads the data from or writes the data into the selected page of the NAND array 300 according to the reading command or the writing command from the host computer. Reading or writing is performed in units of pages. When writing is performed, the page data input from the input/output circuit 160 is held in the latch 330 of the page buffer/readout circuit 320, and the address is provided to the word line decoder 140, the Y decoder 150, and the reading/writing control unit 180. After that, the page data is written into the selected page of the NAND array 300.

If the power supply voltage VDD drops to the power-off level before writing into the selected page is completed, the reading/writing control unit 180 turns off the transistor BLCN in response to the power-off detection signal PD_DET and interrupts writing into the NAND array 300. Instead, the transistor of the entry gate 110C is turned on, and the writing voltage is applied to the word line WLQ0, thereby applying a bias voltage for setting or resetting writing to the source line SLQ0 according to the data held in the latch 330. In this way, the unwritten page data held in the page buffer/readout circuit 320 is written into the variable resistance array 110B. In the case of the example, all data of one page become the unwritten data. At this time, the reading/writing control unit 180 writes the address of the selected page for the specific NAND array into a redundant region of the variable resistance array 110B.

After that, when the power supply voltage VDD is restored, and the power-on level is detected by the power-on detection unit 170, the reading/writing control unit 180 executes the power-on sequence to read and set the unwritten data of one page of the variable resistance array 110B in the latch 330. Next, based on the address read from the redundant region, the page of the NAND array 300 is selected, and the unwritten data held in the latch 330 is written into the selected page. As a result, the writing interrupted by the fluctuation of the power supply voltage VDD is automatically restored when powered on.

Although the preferred embodiments of the disclosure have been described in detail, the disclosure is not limited to the specific embodiments, and various modifications and changes may be made within the spirit and scope of the disclosure defined in the appended claims.

What is claimed is:

1. A semiconductor memory device, comprising:
   a memory cell array, comprising a first memory cell array having a NOR or a NAND flash memory structure and a second memory cell array having a variable resistance memory structure;
   a control unit, controlling reading and writing of a selected memory cell in the first memory cell array or the second memory cell array; and
   a first detection unit, detecting whether a power supply voltage drops to a power-off level,
   wherein when the power-off level is detected by the first detection unit during a writing operation to the first memory cell array, the control unit writes an unwritten data that at least has not been written yet into the first memory cell array into the second memory cell array.

2. The semiconductor memory device according to claim 1, further comprising a second detection unit, wherein the second detection unit detects whether the power supply voltage has reached a power-on level,
   when the power-on level is detected by the second detection unit, the control unit reads the unwritten data from the second memory cell array and writes the read unwritten data into the first memory cell array.

3. The semiconductor memory device according to claim 2, wherein the control unit further writes an address for writing into the first memory cell array into the second memory cell array together with the unwritten data,
   the control unit writes the unwritten data into the first memory cell array based on the address read from the second memory cell array.

4. The semiconductor memory device according to claim 2, wherein the control unit further writes a command for writing into the first memory cell array into the second memory cell array together with the unwritten data,
   the control unit writes the unwritten data into the first memory cell array based on a command read from the second memory cell array.

5. The semiconductor memory device according to claim 2, further comprising a data holding unit, wherein the data holding unit holds data input from an outside,
   the control unit writes the data held in the data holding unit into the first memory cell array, and writes the unwritten data held in the data holding unit into the second memory cell array when the power-off level is detected.

6. The semiconductor memory device according to claim 5, wherein the data holding unit holds page data input from the outside, the control unit writes the page data held by the data holding unit into a selected row in the first memory cell array based on a page writing command input from the outside, and the control unit further writes the unwritten data read from the second memory cell array into the selected row.

7. The semiconductor memory device according to claim 5, wherein the data holding unit holds byte data input from the outside, the control unit writes the byte data held by the data holding unit into a selected row in the first memory cell array based on a byte writing command input from the outside, and the control unit further writes the unwritten data read from the second memory cell array into the selected row.

8. The semiconductor memory device according to claim 5, further comprising a data selection unit, wherein the data selection unit selects data held by the data holding unit,
   the control unit writes the data selected by the data selection unit into a selected memory cell in the first memory cell array and writes data not selected by the data selection unit into the second memory cell array.

9. The semiconductor memory device according to claim 1, wherein the control unit further writes an address for writing into the first memory cell array into the second memory cell array together with the unwritten data,
   the control unit writes the unwritten data into the first memory cell array based on the address read from the second memory cell array.

10. The semiconductor memory device according to claim 1, wherein the control unit further writes a command for writing into the first memory cell array into the second memory cell array together with the unwritten data,
    the control unit writes the unwritten data into the first memory cell array based on a command read from the second memory cell array.

11. The semiconductor memory device according to claim 1, further comprising a data holding unit, wherein the data holding unit holds data input from an outside,
    the control unit writes the data held in the data holding unit into the first memory cell array, and writes the unwritten data held in the data holding unit into the second memory cell array when the power-off level is detected.

12. The semiconductor memory device according to claim 11, wherein the data holding unit holds page data input from the outside, the control unit writes the page data held by the data holding unit into a selected row in the first memory cell array based on a page writing command input from the outside, and the control unit further writes the unwritten data read from the second memory cell array into the selected row.

13. The semiconductor memory device according to claim 11, wherein the data holding unit holds byte data input from the outside, the control unit writes the byte data held by the data holding unit into a selected row in the first memory cell array based on a byte writing command input from the outside, and the control unit further writes the unwritten data read from the second memory cell array into the selected row.

14. The semiconductor memory device according to claim 11, further comprising a data selection unit, wherein the data selection unit selects data held by the data holding unit, the control unit writes the data selected by the data selection unit into a selected memory cell in the first memory cell array and writes data not selected by the data selection unit into the second memory cell array.

15. The semiconductor memory device according to claim 1, wherein the control unit writes the unwritten data into the second memory cell array using a voltage between the power-off level and a minimum voltage that becomes a writing limit of the second memory cell array.

16. The semiconductor memory device according to claim 1, wherein the memory cell array comprises a bit line shared by the first memory cell array and the second memory cell array and an entry gate connected between the first memory cell array and the second memory cell array, and selectively connecting or disconnecting the bit line to the second memory cell array.

17. The semiconductor memory device according to claim 16, wherein the second memory cell array comprises a page, and the second memory cell array is disposed below a bit line selection circuit for selecting the bit line.

* * * * *